(12) United States Patent
Pion

(10) Patent No.: US 8,970,264 B2
(45) Date of Patent: Mar. 3, 2015

(54) ELECTRICAL ISOLATION DEVICE

(75) Inventor: Francisque J. Pion, Chapeiry (FR)

(73) Assignee: Chauvin Arnoux, Paris (FR)

( * ) Notice: Subject to any disclaimer, the term of this patent is extended or adjusted under 35 U.S.C. 154(b) by 547 days.

(21) Appl. No.: 13/445,501

(22) Filed: Apr. 12, 2012

(65) Prior Publication Data

US 2012/0280151 A1 Nov. 8, 2012

(30) Foreign Application Priority Data

May 2, 2011 (FR) ...................... 11 53738

(51) Int. Cl.
*H03B 1/00* (2006.01)
*H03F 3/08* (2006.01)
*G01R 15/12* (2006.01)

(52) U.S. Cl.
CPC ............... *H03F 3/085* (2013.01); *G01R 15/12* (2013.01)
USPC .......................................... 327/110; 327/304

(58) Field of Classification Search
None
See application file for complete search history.

(56) References Cited

U.S. PATENT DOCUMENTS

| 5,517,154 | A | | 5/1996 | Baker et al. |
| 5,574,396 | A | * | 11/1996 | Drainville ...................... 327/337 |
| 6,169,801 | B1 | * | 1/2001 | Levasseur et al. ............ 379/413 |
| 2004/0217782 | A1 | * | 11/2004 | Brown .......................... 327/108 |

FOREIGN PATENT DOCUMENTS

EP 0 875 765 11/1998
WO WO2008/061444 5/2008

* cited by examiner

*Primary Examiner* — Cassandra Cox
(74) *Attorney, Agent, or Firm* — Hamre, Schumann, Mueller & Larson, P.C.

(57) ABSTRACT

The invention relates to an analog isolation device (100) comprising a primary part (102) and a secondary part (104) separated by an electrical isolation barrier, these parts including a high-frequency channel configured to produce a high-frequency component in the secondary part and a low-frequency channel configured to produce a low-frequency component in the secondary part, in order to form the output signal from the high-frequency and low-frequency components, the device further including a control circuit (D1, 132) configured to receive, in the primary part, a setpoint signal ($S_{ic}$) and a so-called image signal ($S_{oim}$) representative of the output signal ($S_o$) and to apply in the high-frequency and/or low-frequency channel a correction signal $V_{COR}$ as a function of the difference between the image signal and the setpoint signal in order to cause that difference to tend toward zero.

13 Claims, 6 Drawing Sheets

ELECTRICAL ISOLATION DEVICE

BACKGROUND OF THE INVENTION

The invention relates to an electrical isolation device capable of coupling together two circuits at frequencies from direct current (DC) up to high frequencies, which two circuits are at different electrical potentials, and the invention notably applies to electrical measuring instruments such as voltmeters and oscilloscopes.

A problem arises when the source of a signal to be measured and the measuring instrument itself do not share a common ground reference.

Floating-ground operation of the measuring instrument is not a satisfactory solution, firstly because the accuracy of the measurement may be affected by the presence of ground currents, and secondly because there is a risk of the potential of the measuring instrument reaching a dangerous level.

Proposals have therefore been made to transmit a signal that is to be measured across an electrical isolation barrier disposed between the source of the signal and the measuring instrument, which source and instrument may then retain their respective ground references, with floating-ground operation of the measuring instrument thus being avoided.

An analog isolation device incorporating such an electrical isolation barrier and shown diagrammatically in FIG. 1 is described in the document EP 0 875 765.

That known device 10 comprises a primary part 12 and a secondary part 14 isolated from each other by an isolation barrier 16. As shown in FIG. 1, the primary and secondary parts are connected to respective independent grounds.

The device 10 receives an input signal at an input A of the primary part 12 and is designed to deliver an isolated output signal at an output B of the secondary part 14, reproducing the input signal 16. To this end, the device 10 must have a flat frequency response, that is to say it must supply an output signal of amplitude that is identical (ignoring any multiplier coefficient) to the amplitude of the input signal, and it must do so across the whole of the range of usable frequencies.

To this end, the device comprises two parallel channels, a high-frequency (HF) channel conveying the HF component of the input signal and a low-frequency (LF) channel conveying the LF component of the input signal, the output signal being obtained by summing the LF and HF components that reach the secondary part.

The HF channel includes a transformer 18 having its primary P connected to the input A. On its secondary winding S, the transformer 18 faithfully reproduces the HF component of the input signal, but its frequency response deteriorates rapidly at low frequencies.

The LF channel includes an opto-coupler 20 comprising an electro-optical emitter 20a, such as a light emitting diode (LED), connected to the input A and coupled on the secondary side to an opto-electric receiver, such as a photodiode 20b, that delivers current that is converted to a voltage by a circuit 22. The opto-coupler 20 further includes a second opto-electric receiver, such as a photodiode 20c similar to the photodiode 20b and also coupled to the electro-optical emitter 20a, but situated on the primary side, the current from the photodiode 20c being converted into a voltage by a circuit 24. The output voltage of the circuit 24 is applied to the inverting input of an amplifier 26 receiving the input signal on its non-inverting input, the circuit 24 and the amplifier 26 forming a feedback loop for linearizing the response of the opto-coupler 20. The opto-coupler 20 faithfully reproduces the LF component of the input signal, but its frequency response deteriorates rapidly at high frequencies.

The transformer 18 and the opto-coupler 20 form the electrical isolation barrier 16. The output signal is obtained by summing the HF component on the secondary of the transformer 18 and the LF component at the output of the circuit 22 by means of a circuit 28.

FIG. 2 is a Bode diagram showing the frequency responses $H1(f)$ and $H2(f)$ of the LF and HF channels, respectively.

To obtain a flat overall frequency response, that is to say for the output signal faithfully to reproduce the input signal throughout the range of useful frequencies, it is necessary for there to be a corresponding relationship between the high cut-off frequency $F_{LF1}$ of the LF channel (opto-coupler 20) and the low cut-off frequency $F_{HF1}$ of the HF channel (transformer 18).

To this end, a fraction of the output voltage of the circuit 24 as determined by a divider circuit 30 is applied to the non-inverting input of an amplifier 32 having its inverting input receiving the input signal and having its output connected to primary P of the transformer 18. The output voltage of the circuit 24 is an image of the LF component transmitted to the secondary via the opto-coupler 20. The division ratio of the circuit 30 is adjusted to subtract from the input signal a fraction of the LF component such that the cut-off frequency $F_{HF}$ is aligned with the cut-off frequency $F_{LF}$.

The Applicant has nevertheless determined that that technique of compensating misalignment of the cut-off frequencies of the LF and HF channels does not guarantee a totally satisfactory result, that is to say the absence of any significant distortion of the output signal compared to the input signal. It is difficult to adjust the division ratio of the circuit 30 in an optimal fashion. Moreover, there is no compensation of asymptotic response errors in the LF channel resulting from the presence of orders higher than 1 in the cut-off frequency of that channel. Moreover, since the compensation is effected by aligning the cut-off frequency of the HF channel with that of the LF channel, the LF channel operates at full bandwidth, and it is necessary for the output from the opto-coupler going respectively to the secondary part via the photodiode 20b and to the primary part via the photodiode 20c to have the same bandwidth and the same gain, which requires delicate adjustments and components to be chosen that have small differences between their characteristics.

OBJECT AND SUMMARY OF THE INVENTION

The aim of the invention is to remedy the drawbacks referred to above by proposing an analog isolation device capable of faithful reproduction of an input signal without notable distortion in a very wide range of frequencies.

To obtain a transfer function totally free of amplitude and phase distortion, three conditions must be combined:
  equality of the HF and LF gains in each bandwidth;
  cut-off frequencies equal to within −3 dB; and
  cut-off orders that are the same of the high-pass (HF) cut-off is of the first order, then the low-pass (LF) cut-off must also be of the first order).

The above aim is achieved by an analog isolation device comprising a primary part having an input adapted to receive an input signal and a secondary part separated from the primary part by an electrical isolation barrier and having an output for delivering an output signal reproducing the input signal;
  the primary part and the secondary part including a high-frequency channel having a low cut-off frequency and configured to receive the input signal in the primary part and to produce a high-frequency component in the secondary part from the input signal, and a low-frequency channel having a high cut-off frequency and configured to receive the input signal in the primary part and to produce a low-frequency component in the secondary part from the input signal, in order to form the output signal from the high-frequency and low-frequency components;

the device being provided with a control circuit configured to receive, in the primary part, a setpoint signal representative of the input signal and a so-called image signal representative of the output signal, and to apply in the high-frequency and/or low-frequency channel a correction signal as a function of the difference between the image signal and the setpoint signal in order to cause that difference to tend towards zero.

This device is advantageous in that it applies closed loop control to compensate distortion of the output signal relative to the input signal dynamically and regardless of its causes.

The correction signal may be applied to the low-frequency channel only, to the high-frequency channel only, or to both channels.

According to one feature of the device, the primary part includes a summing element adapted to produce the image signal by summing a first signal representative of said low-frequency component and a second signal representative of said high-frequency component.

The first signal and the second signal may be in the form of currents or voltages.

According to another feature of the device, the low-frequency channel comprises an electro-optical coupler forming part of the electrical isolation barrier and having an electro-optical emitter, a first opto-electrical receiver situated in the secondary part and coupled to the electro-optical emitter to produce a current enabling said low-frequency component to be generated, and a second opto-electrical receiver situated in the primary part and coupled to the emitter to produce a current enabling said first signal representative of said low-frequency component to be generated. The correction signal $V_{COR}$ may be applied to a circuit for linearizing the opto-coupler connected to the electro-optical emitter.

According to another feature of the device, the high-frequency channel includes a transformer forming part of the electrical isolation barrier and having a primary situated in the primary part and a secondary situated in the secondary part to obtain said high-frequency component from a voltage taken from the secondary of the transformer and to obtain said second signal representative of said high-frequency component from a voltage taken from the primary of the transformer. The correction signal $V_{COR}$ may be in the form of a voltage applied to the primary of the transformer.

The control circuit preferably has a high cut-off frequency at least 100 times greater than the low cut-off frequency of the high-frequency channel. Thus, beyond the cut-off frequency of the control circuit, the input signal is transmitted virtually exclusively via the high-frequency channel and the problem of misalignment between the cut-off frequencies of the low-frequency and high-frequency channels no longer arises.

BRIEF DESCRIPTION OF THE DRAWINGS

The invention can be better understood on reading the following description given by way of non-limiting illustration only and with reference to the appended drawings, in which.

DETAILED DESCRIPTION OF EMBODIMENTS

Figure 1:
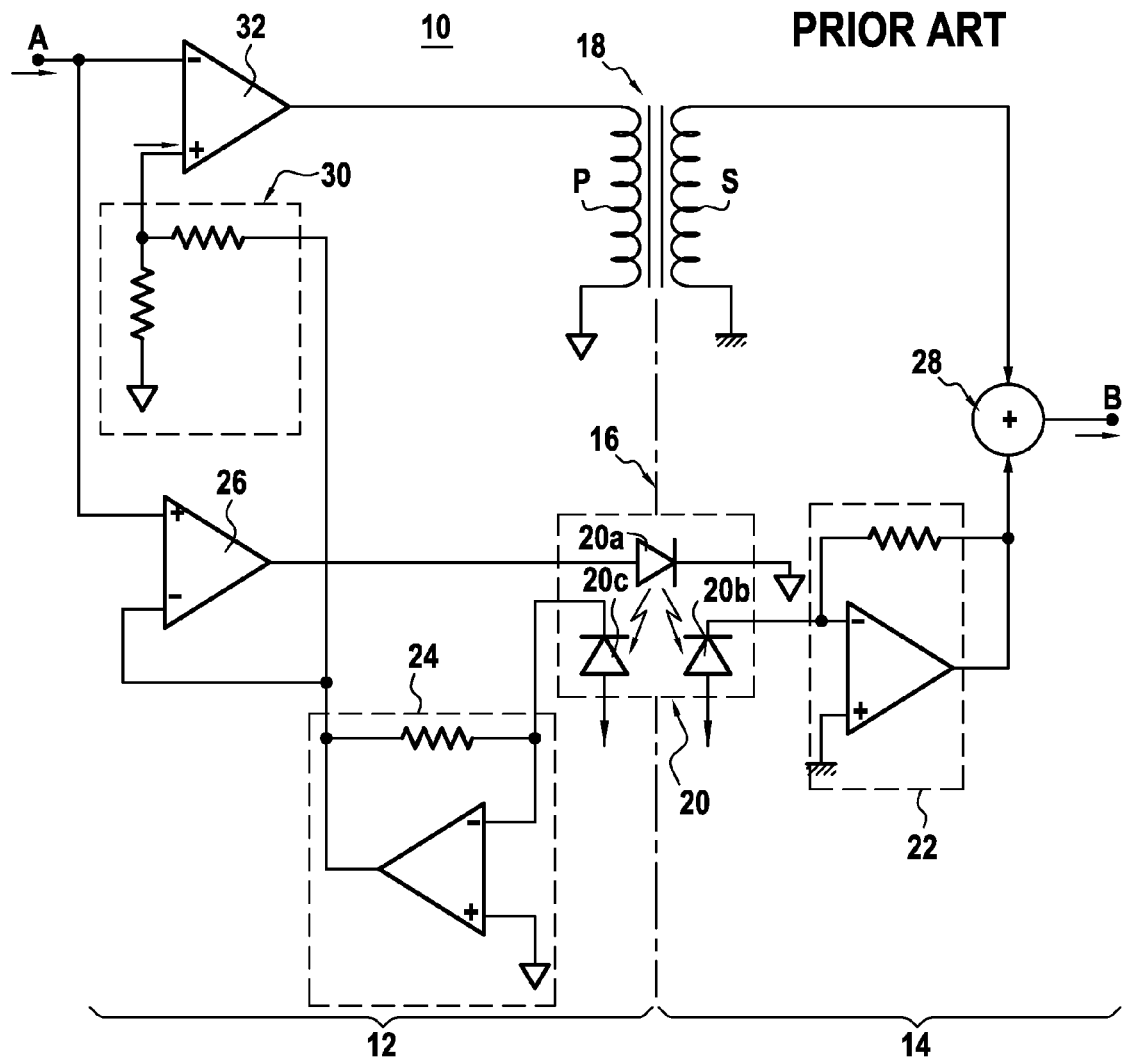
FIG. 1, described above, shows a known prior art isolation device.
Figure 2:
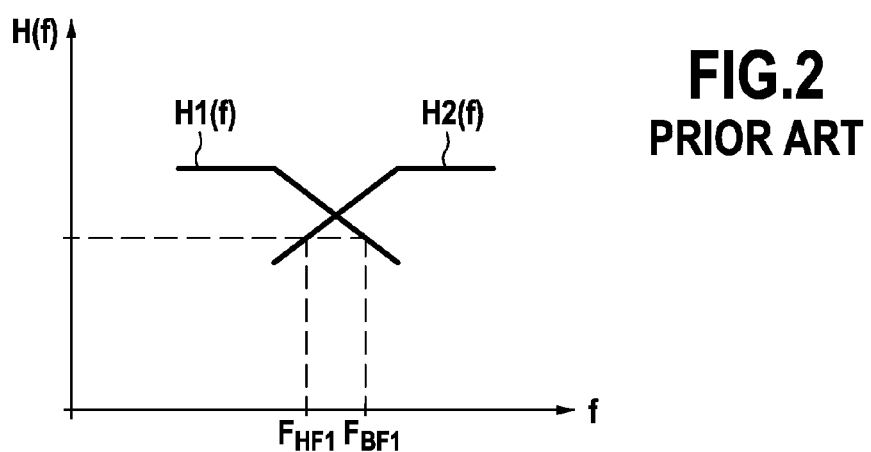
FIG. 2, described above, shows the frequency responses of a transformer and of an opto-coupler of the FIG. 1 device.
Figure 3:
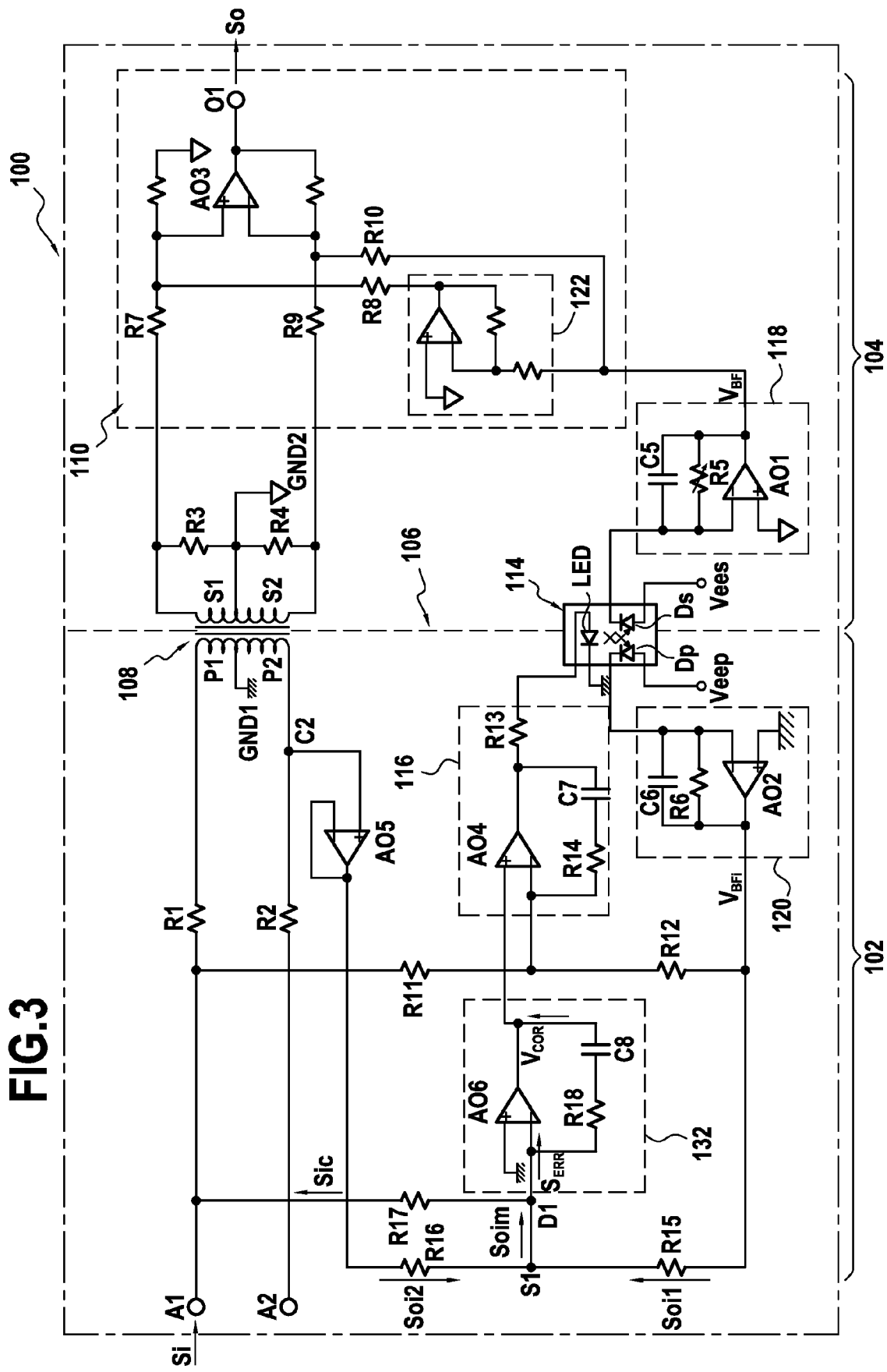
FIG. 3 shows an isolation device of a first embodiment of the invention.

The isolation device from FIG. 3 comprises a primary part 102 and a secondary part 104 isolated from each other by an electrical isolation barrier 106. These two parts have respective independent grounds GND1 and GND2. The device 100 is designed to receive an input signal $S_i$ at the input of the primary part and to deliver at the output of the secondary part an output signal $S_o$ reproducing the signal $S_i$, where applicable with a multiplier coefficient not equal to 1. In the FIG. 3 embodiment, the input signal $S_i$ is a differential signal received at a bipolar input A1, A2 and the output signal is a non-differential signal emitted at a unipolar output O1.

The isolation device 100 comprises two parallel channels, namely a high-frequency (HF) channel and a low-frequency (LF) channel.

The HF channel includes a transformer 108 forming part of the isolation barrier 106. In the primary part 102, the transformer has a primary with two half-windings P1, P2 having first ends connected to the input ports A1, A2 via respective resistors R1, R2 and second ends connected in common to the ground GND1. In the secondary part 104, the transformer 108 has a secondary with two half-windings S1, S2 having first ends connected to a summing circuit 110 and second ends connected to the ground GND2. Resistors R3, R4 respectively connected between the first ends of the half-windings S1, S2 and the ground GND2 serve both to adjust the fractions of the voltages that are taken from the half-windings S1, S2 and that are applied to the summing circuit 110 and also to load the secondary of the transformer 108. It should be noted that grounding the half-windings on the primary side and on the secondary side provides good common mode rejection without requiring the use of a screen in the transformer.

The transformer 108 has a low cut-off frequency $F_{HF}$ (cut-off frequency of the HF channel). Accordingly, from the input signal, the HF channel enables the secondary part 104 to produce a high-frequency component that, in the FIG. 3 embodiment, is applied to the summing circuit 110 in differential form.

The LF channel includes an opto-coupler 114 forming part of the isolation barrier 106. The opto-coupler 114 includes an electro-optic emitter, typically an LED, optically coupled both to a first opto-electric receiver $D_p$ situated in the secondary part and also to a second opto-electric receiver situated in the first part. The receivers $D_s$ and $D_p$ are typically photodiodes having respective bias voltages $V_{ees}$ and $V_{eep}$ applied thereto. The LED is connected to one of the input ports (A1 in the example shown), notably via a linearization circuit 116 as described below. The current from the receiver $D_s$ is converted into a voltage by means of a converter circuit 118 including an operational amplifier AO1 having an inverting input connected to the receiver D, and a non-inverting input, connected to the ground GND2. A circuit formed by a resistor R5 shunting a capacitor C5 is connected between the output of the amplifier AO1 and its inverting input. In a similar fashion, the current from the receiver $D_p$ is converted into voltage by means of a converter circuit 120 including an operational amplifier AO2 having an inverting input connected to the receiver $D_p$ and a non-inverting input connected to the ground GND1. A circuit formed by a resistor R6 shunting a capacitor C6 is connected between the output of the amplifier AO2 and its inverting input.

The combination of the LED and the receiver $D_s$ has a high cut-off frequency $F_{LF}$ (cut-off frequency of the LF channel). Accordingly, starting from the input signal, the LF channel enables the secondary part 104 to produce a low-frequency component $V_{LF}$ available at the output of the converter 118 and applied to the summing circuit 110.

The summing circuit 110 includes an operational amplifier AO3 having a non-inverting input connected to the first end of the half-winding S1 via a resistor P3 and connected to the output of the converter circuit 118 via an inverting circuit 122 and a resistor R8. The inverting input of the amplifier AO3 is connected to the first end of the half-winding S2 via a resistor R9 and is connected to the output of the converter circuit 118 via a resistor R10. The output of the amplifier AO3 is connected to the output O1 of the secondary part. The inverter 122 enables a low-frequency component to be produced in differential form for summing with the differential high-frequency component, and the amplifier AO3 delivers the output signal in non-differential (unipolar) form.

It would also be possible to obtain an output signal in differential form by using a second opto-coupler analogous to the opto-coupler 114 and connected to the second input port in order to obtain a low-frequency component that is in differential form, and to combine it with the high-frequency component in differential form, the isolation device then being entirely bipolar.

At the output of the converter 120 there is a voltage $V_{LFi}$ that is equal or substantially equal to the low-frequency component $V_{LF}$ in that the gains of the respective combinations formed by the LED and the receiver D and by the LED and the receiver $D_p$ are substantially equal, and likewise their cut-off frequencies are substantially equal since the amplifiers AO1 and AO2 are identical. The resistor R5 is advantageously a variable resistor in order to be able to equalize these gains, while the capacitors C5 and C6 enable the high cut-off frequencies to be equalized.

The linearization circuit 116 includes an operational amplifier AO4 having its inverting input connected to the input port A1 via a resistor R11 and to the output of the converter 120 via a resistor R12. The output of the amplifier AO4 is connected to the LED via a resistor R13 and a circuit formed by a capacitor C7 in series with a resistor R14 is connected between the output of the amplifier AO4 and its inverting input. The ratio between the resistances of the resistors R11 and R12 determines the gain of the LF channel.

To obtain an output signal $S_o$ that faithfully reproduces the input signal $S_i$, it is necessary to correct a misalignment between the cut-off frequencies $F_{LF}$ and $F_{HF}$ of the LF and HF channels. The invention does this by the primary part reproducing an image signal $S_{oim}$ representative of the signal $S_o$ and injecting a correction signal into the LF channel and/or into the HF channel, which correction signal is produced from the difference between the signals $S_i$ and $S_{cim}$.

In the FIG. 3 embodiment, the correction signal $V_{COR}$ is injected into the LF channel.

To produce the image signal $S_{oim}$, a first signal $S_{oi1}$ representative of the LF component transmitted into the secondary part 104 by the opto-coupler 114 and a second signal $S_{oi2}$ representative of the HF component transmitted into the secondary part 104 are summed by the transformer 108. The output of the converter 120 is connected to a summing node S1 via a resistor R15 to provide the signal $S_{oi1}$ in the form of a current. The voltage at the first end of one of the half-windings of the primary of the transformer, here the winding P2, is the image of the voltage at the corresponding secondary half-winding. The first end C2 of the half-winding P2 (which is connected to the input port A2 via the resistor R2) is connected to the summing node S1 via an operational amplifier AO5 and a resistor R16 to provide the signal $S_{oi2}$ in the form of a current. In the example in which the transformer 108 and the opto-coupler 114 have the same gain and the amplifier AO5 has unity gain, the values of the resistors R15 and R16 are chosen so that R15=2×R16 to take account of the fact that the voltage at the point C2 represents only half the overall HF component transmitted into the secondary part 104.

The image signal (current) $S_{oim}$ obtained at the point S1 by summing the currents $S_{oi1}$ and $S_{oi2}$ is applied to a summing point D1 that is also connected to the input port A1 via a resistor R17. The summing point D1 therefore receives the image signal $S_{oim}$ and a setpoint signal $S_{ic}$ representative of the input signal $S_i$, which signals $S_{oim}$ and $S_{ic}$ have opposite polarities. The resistor R17 is chosen so that the signals $S_{oim}$ and $S_{ic}$ in the form of currents represent the signals $S_o$ and $S_i$ in the same ratio so as to be meaningfully comparable (in the example where the output signal $S_o$ reproduces the input signal $S_i$ in a ratio equal to 1).

The error signal $S_{ERR}$ in the form of a current representing the difference between $S_{ic}$ and $S_{oim}$ and coming from the summing point D1 is applied to the input of a PI (proportional/integral) corrector circuit 132. In conventional manner, the circuit 132 includes an operational amplifier AO6 having its non-inverting input connected to the ground GND1, its inverting input connected to the summing point D1, and its output connected to its inverting input via a circuit formed of a capacitor C8 in series with a resistor R18. A correction signal is thus obtained at the output of the P1 corrector circuit 132, which correction signal, here a voltage $V_{COR}$, is applied to the LF channel by being injected in the linearization circuit 116 into the non-inverting input of the amplifier AO4. The current injected into the LED of the opto-coupler is therefore modified as a function of the difference between the image $S_{oim}$ of the output signal and the input signal $S_i$.

Closed loop control is thus achieved, with the correction signal $V_{COR}$ modifying the operation of the LF channel to cancel out the difference between the image $S_{oim}$ of the output signal and the input signal $S_i$, that is to say by aligning the cut-off frequency $F_{LF}$ of the LF channel with the cut-off frequency $F_{HF}$ of the HF channel and by aligning the asymptotic responses (cut-off order).

The control circuit, which is formed of the elements for producing the image signal $S_{oim}$ and the error signal $S_{ERR}$ and of the PI corrector circuit 132 delivering the correction signal $V_{COR}$, has its own high cut-off frequency $F_{CASS}$ and is preferably designed so that this high cut-off frequency is very much higher than the low cut-off frequency $F_{HF}$ of the HF channel. It is advantageous if $F_{CASS} \geq 100\ F_{HF}$, or even $F_{CASS} \geq 1000\ F_{HF}$. Thus beyond the frequency $F_{CASS}$, all or almost all of the input signal is transmitted by the HF channel only, with the result that the loss of the effective servo-control becomes inconsequential. The high cut-off frequency $F_{CASS}$ may be set by operating on the values of the capacitor C8 or of the resistors R16, R17, and/or R15.

Figure 4A:
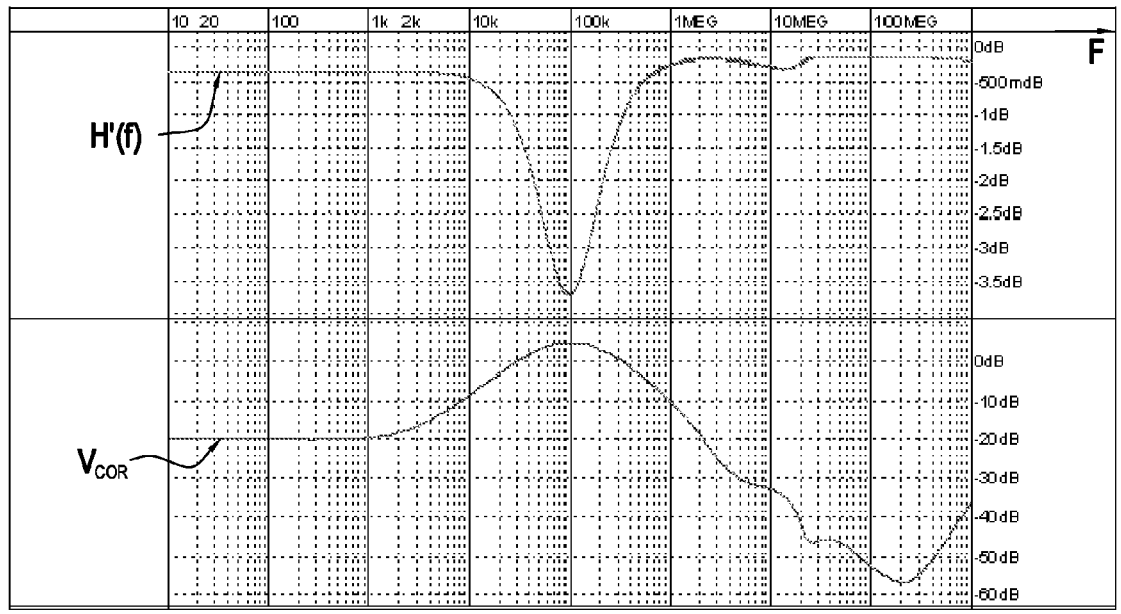
FIG. 4A shows a frequency response of a device such as that of FIG. 3 and the variation of the correction signal when no correction signal is applied.

FIG. 4A shows the frequency response H'(f) of an isolation device like that from FIG. 3 and the variation of the correction signal $V_{COR}$ with no correction signal applied, that is to say with the connection open between the PI corrector circuit 132 and the linearization circuit 116, its amplifier AO4 having its non-inverting input connected to the ground GND1. High distortion of the output signal is observed in an intermediate frequency range by reason of a misalignment between the cut-off frequencies $F_{LF}$ and $F_{HF}$ and the corresponding variation of the correction signal $V_{COR}$ (the distortion is lower with closed loop control).

Figure 4B:
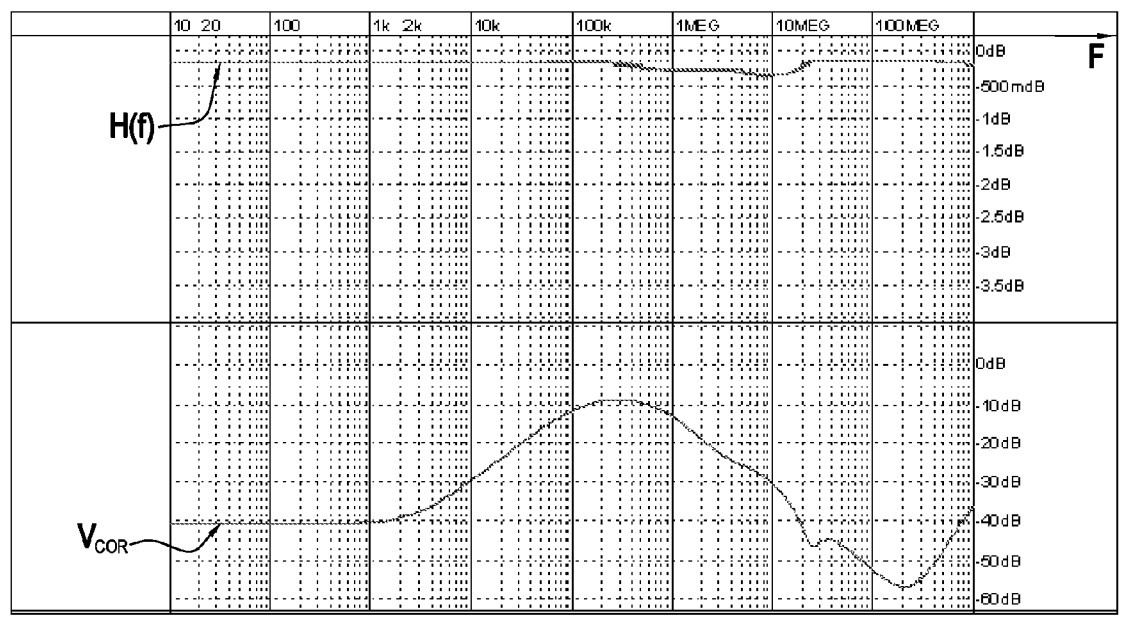
FIG. 4B shows the frequency response of the device of FIG. 3 and the variation of the correction signal when a correction signal is applied.

FIG. 4B shows the frequency response H(f) of the FIG. 3 device with the correction signal $V_{COR}$ applied and the corresponding variation of the correction signal. Distortion is found to be virtually absent in the output signal, closed loop control enabling compensation of various causes of distortion, notably a defective asymptotic response in the LF channel. Furthermore, by aligning the cut-off frequency of the LF channel with the substantially lower cut-off frequency of the HF channel, the LF channel is made to function in a reduced bandwidth, enabling the influence of spurious signals transmitted by capacitive coupling to be reduced, and thus enabling common mode rejection in the LF channel to be improved.

Figure 5:
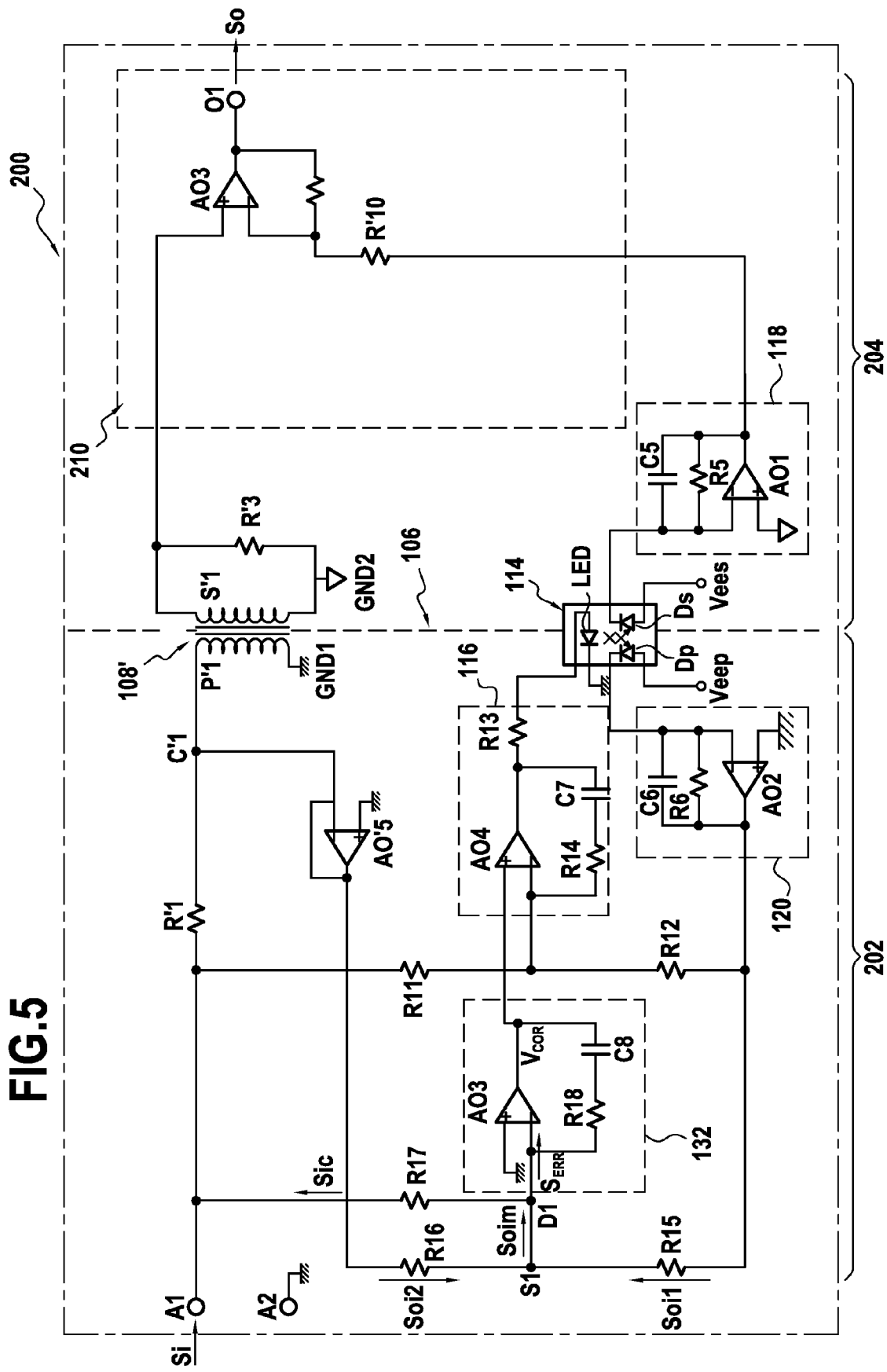
FIGS. 5, 6, and 7 show isolation devices of second, third, and fourth embodiments of the invention, respectively.
Figure 6:
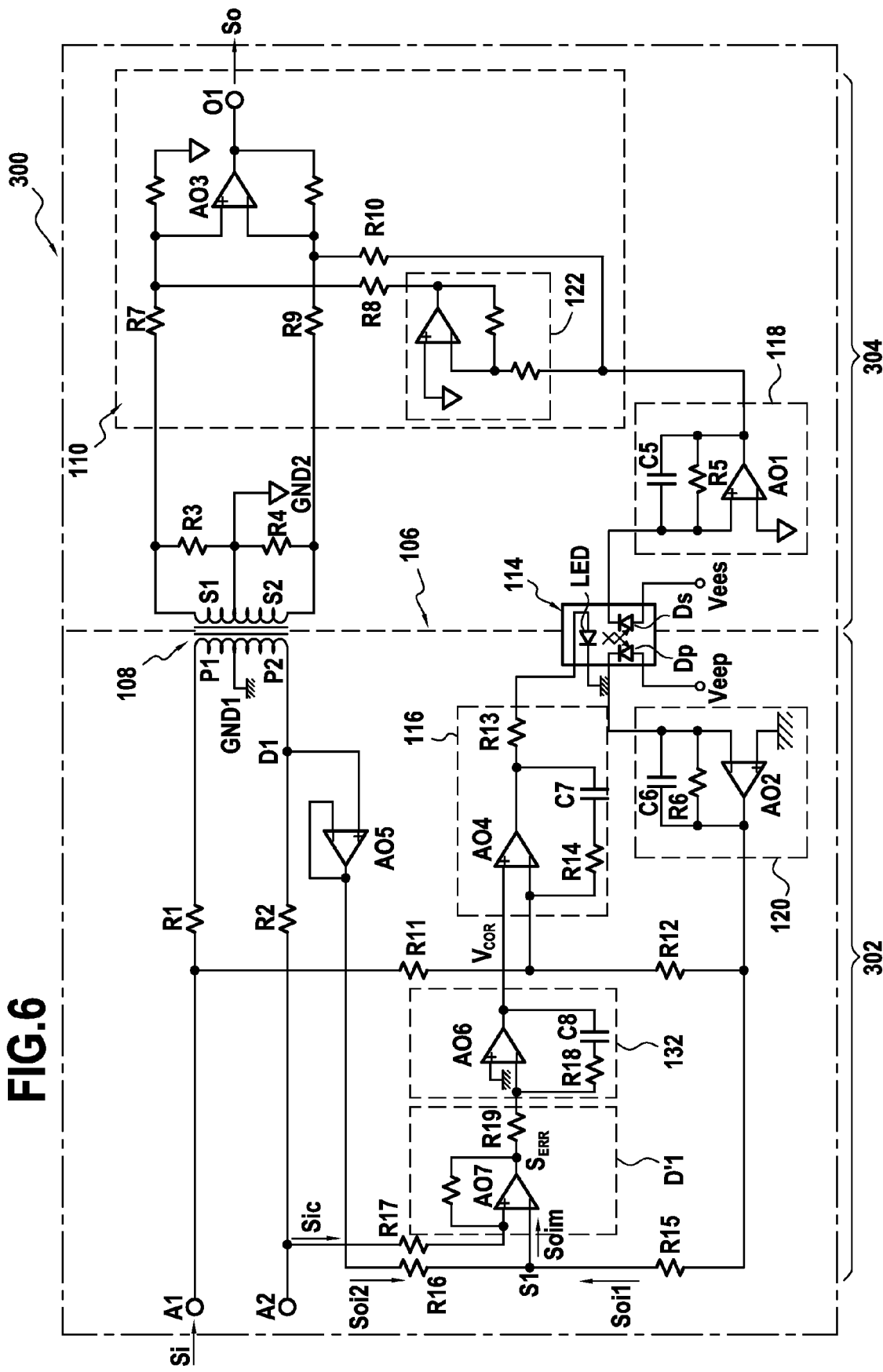
Figure 7:
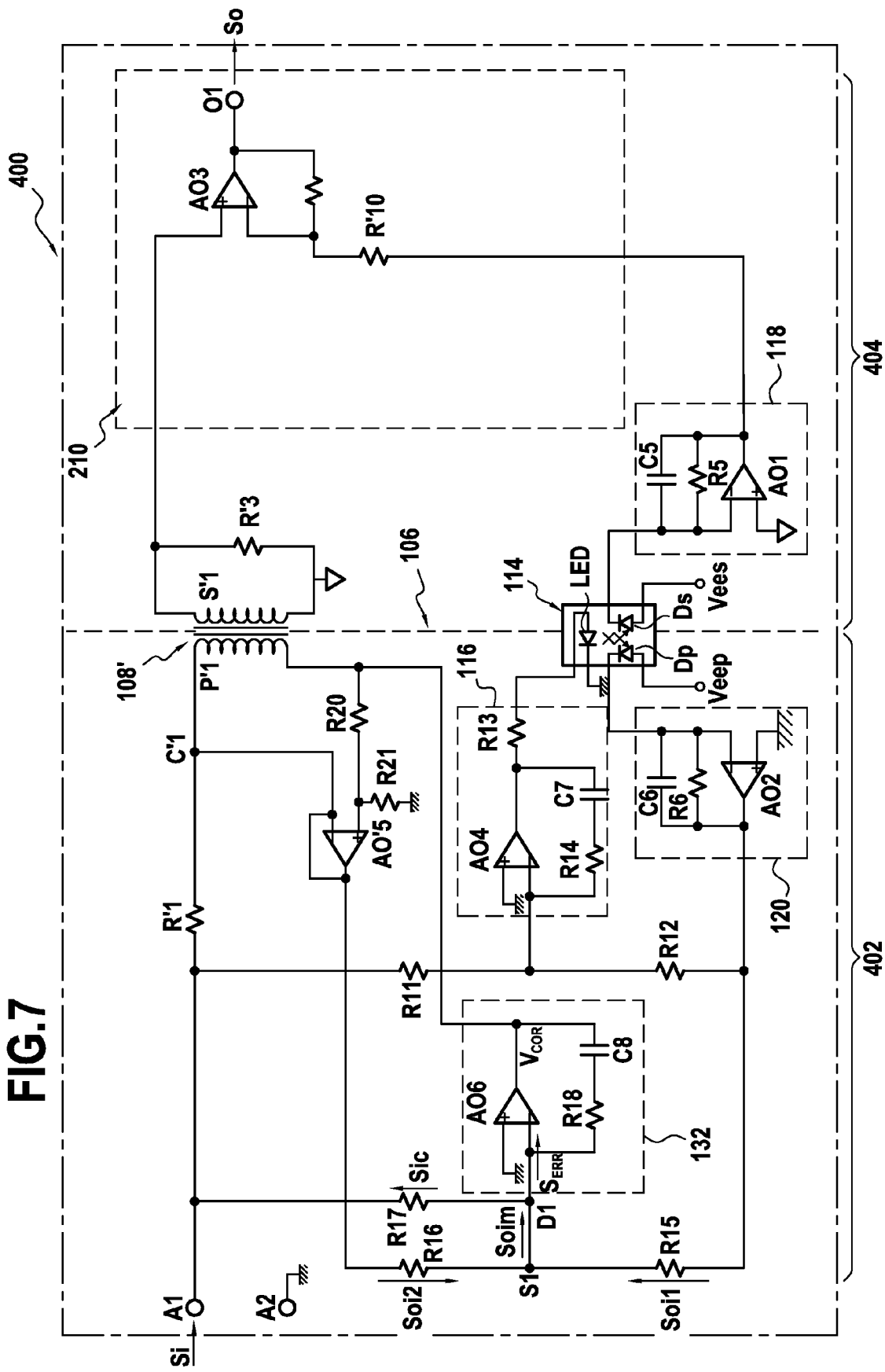

FIGS. 5, 6, and 7 show other embodiments.

In the FIG. 5 isolation device 200, the input, of the isolation device is unipolar, the non-differential input signal $S_i$ received at the terminal A1 and the terminal A2 being connected to the ground GND1. Elements common to the embodiment of FIG. 5 and of FIG. 3 carry the same references and are not described again.

In the primary part 202, the transformer 108' includes a single primary winding P'1 having a first end connected to the input port A1 via a resistor R'1 and a second end connected to the ground GND1. In the secondary part 204, the transformer 108' includes a single secondary winding S'1 having a first end connected to a summing circuit 210 and a second end connected to the ground GND2. The first end of the winding S'1 is furthermore connected to the ground GND2 via a resistor R'3. The summing circuit 210 essentially comprises an operational amplifier having a non-inverting input connected to the first end of the winding S'1 and an inverting input connected to the output of the converter circuit 118 via a resistor R'10, the resistors R'3 and R'10 enabling the ratio between the HF and LF components applied to the summing circuit 210 to be adjusted.

In the primary part 202, the image signal $S_{oim}$ of the output signal $S_o$ is fed to the summing point S1 that is connected to the output of the converter circuit 120 via the resistor R15 and that is connected to the first end C'1 of the winding P via an operational amplifier AO'5 and a resistor R16, the ratio between the resistances of the resistors R15 and R16 being equal to 1 here. To be more precise, the amplifier AO'5 has its inverting input connected to the point C'1, and its output and its non-inverting input connected to the ground GND1. The signal $S_{oim}$ is fed to the summing point D1, which also receives the signal $S_{ic}$ because it is connected to the input port A1 via the resistor R17. The signals $S_{oim}$ and $S_{ic}$ (in the form of currents) have opposite polarities. The error signal $S_{ERR}$ coming from the point D1 is converted by the PI corrector circuit 132 into a correction signal $V_{COR}$ applied to the linearization circuit 116, as in the FIG. 3 embodiment.

In the isolation device 300 from FIG. 6, the image signal $S_{oim}$ is in the form of a voltage. Elements common to the isolation devices 300 and 100 carry the same references and are not described again.

The secondary part 304 of the isolation device 300 is similar to the secondary part 104 of the isolation device 100.

The primary part 302 of the device 300 differs from the primary part 102 of the device 100 in that the summing point D1 is replaced by a differential circuit D'1 with an operational amplifier A07 having its inverting input connected to the summing point S1 to receive the signal $S_{oim}$ and having its non-inverting input connected to the port B1 to receive the signal $S_{ic}$. The error signal $S_{ERR}$ in the form of a voltage at the output of the amplifier AO7 is applied to the PI corrector circuit 132 via a resistor R19 to generate the correction signal $V_{COR}$ applied to the linearization circuit 116.

In the isolation device 400 of FIG. 7, the input signal $S_i$ is in unipolar form and the correction signal $V_{COR}$ is applied to the HF channel. Elements common to the isolation device 400 and to the device 200 of FIG. 5 carry the same references and are not described again.

The secondary part 404 of the isolation device 400 is similar to the secondary part 204 of the isolation device 200.

In the primary part 402 of the isolation device 400, the second end of the primary winding P'1 of the transformer 108 is connected to the output of the PI corrector circuit 132 delivering the correction signal $V_{COR}$. In the linearization circuit 116, the non-inverting input of the amplifier AO4 is connected to the ground GND1.

Furthermore, the non-inverting input of the amplifier AO'5 is connected, not directly to the ground GND1, but to the mid-point of a voltage divider formed by resistors. R20 and R21 in series between the second end of the winding P'1 and the ground GND1. The values of the resistors R20 and R21 are chosen to obtain a signal. $S_{oi2}$ at the output of the amplifier AO'5, which signal $S_{oi2}$ represents the HF component as produced at the secondary of the transformer without being influenced by the correction signal $V_{COR}$ injected on the primary side (differential amplifier).

It should be noted that the particular features of the embodiments described above may be combined in various ways, for example by producing an isolation device with bipolar input and application of the correction signal in the HF channel or by generating an error signal in the form of a voltage as in the FIG. 6 embodiment but with a bipolar input signal and/or application of the correction signal in the HF channel. Moreover, as already indicated, the LF channel may be produced in bipolar form.

What is more, in the diverse variants that may be envisaged, it is possible to replace the transformer of the HF channel and/or the opto-coupler of the LF channel by other components respectively providing the same functions. Accordingly, the transformer may be replaced by any other device able to produce a high-frequency component from the input signal in the secondary part. For example, the transformer 108 or 108' may be replaced by a differential capacitor coupling. Similarly, the opto-coupler 114 may be replaced by any other device able to produce a low-frequency component from the input signal in the secondary part. For example, the opto-coupler 114 may be replaced by a transmission system employing modulation/demodulation of the pulse width or of the frequency of a signal (PWM, Sigma Delta, FM, etc. system). Transmission across the isolation barrier may then be effected via an analog coupler (radio channel, etc.) or via a digital coupler.

By virtue of one of the alternatives of the invention, it is also possible to add an additional winding to the primary of the transformer of the HF channel, that additional winding then supplying the signal $S_{oi2}$ on the primary side.

The invention claimed is:

1. An analog isolation device comprising a primary part having an input adapted to receive an input signal and a secondary part separated from the primary part by an electrical isolation barrier and having an output for delivering an output signal reproducing the input signal;

the primary part and the secondary part including a high-frequency channel having a low cut-off frequency and configured to receive the input signal in the primary part and to produce a high-frequency component in the secondary part from the input signal, and a low-frequency channel having a high cut-off frequency and configured to receive the input signal in the primary part and to produce a low-frequency component in the secondary part from the input signal, in order to form the output signal from the high-frequency and low-frequency components;

the device being characterized by a control circuit configured to receive, in the primary part, a setpoint signal representative of the input signal and a so-called image signal representative of the output signal, and to apply in the high-frequency and/or low-frequency channel a correction signal as a function of the difference between the image signal and the setpoint signal in order to cause that difference to tend towards zero.

2. A device according to claim 1, characterized in that the correction signal is applied only to the low-frequency channel.

3. A device according to claim 1, characterized in that the correction signal is applied only to the high-frequency channel.

4. A device according to claim 1, characterized in that the primary part comprises a summing element adapted to produce the image signal by summing a first signal representative of said low-frequency component and a second signal representative of said high-frequency component.

5. A device according to claim 4, characterized in that the first signal and the second signal are in the form of currents.

6. A device according to claim 4, characterized in that the first signal and the second signal are in the form of voltages.

7. A device according to claim 4, characterized in that the low-frequency channel comprises an electro-optical coupler forming part of the electrical isolation barrier and having an electro-optical emitter, a first opto-electrical receiver situated in the secondary part and coupled to the emitter to produce a current enabling of said low-frequency component to be generated, and a second opto-electrical receiver situated in the primary part and coupled to the emitter to produce a current enabling said first signal representative of said low-frequency component to be generated.

8. A device according to claim 7, characterized in that the low-frequency channel comprises, in the primary part, a linearization circuit for linearization of the opto-coupler connected to the electro-optical emitter.

9. A device according to claim 8, characterized in that the correction signal is applied to the linearization circuit.

10. A device according to claim 4, characterized in that the high-frequency channel includes a transformer forming part of the electrical isolation barrier and having a primary situated in the primary part and a secondary situated in the secondary part to obtain said high-frequency component from a voltage taken from the secondary of the transformer and to obtain said second signal representative of said high-frequency component from a voltage taken from the primary of the transformer.

11. A device according to claim 10, characterized in that the correction signal is in the form of a voltage applied to the primary of the transformer.

12. A device according to claim 1, characterized in that the control circuit has a high cut-off frequency at least 100 times greater than the low cut-off frequency of the high-frequency channel.

13. An electrical measuring instrument provided with an analog isolation device according to claim 1.

* * * * *